United States Patent
Kunzinger

(10) Patent No.: US 6,813,510 B1
(45) Date of Patent: Nov. 2, 2004

(54) SYSTEM FOR AUTOMATICALLY ADJUSTING RECEIVE PATH GAIN

(75) Inventor: Frederick Francis Kunzinger, Parsippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/480,862

(22) Filed: Jan. 11, 2000

(51) Int. Cl.[7] .............................................. H04B 1/16
(52) U.S. Cl. .................... 455/562.1; 455/561; 455/287; 455/67.11; 327/91
(58) Field of Search ................................ 455/62.1, 561, 455/562, 349, 6.1, 287, 67.11; 327/91

(56) References Cited

U.S. PATENT DOCUMENTS

| | | | |
|---|---|---|---|
| 5,457,811 A | * 10/1995 | Lemson | ...................... 455/67.1 |
| 5,594,760 A | 1/1997 | Guillaud et al. | |
| 5,722,061 A | 2/1998 | Hutchison, IV et al. | |
| 5,722,063 A | 2/1998 | Peterzell et al. | |
| 5,963,854 A | 10/1999 | Andreasson et al. | |
| 6,184,725 B1 | * 2/2001 | Mohr | .......................... 327/91 |
| 6,259,682 B1 | * 7/2001 | Brown et al. | ................ 370/311 |
| 6,269,255 B1 | * 7/2001 | Waylett | ...................... 455/562 |
| 6,374,083 B1 | * 4/2002 | Ketonen | ..................... 455/67.1 |

\* cited by examiner

Primary Examiner—Nick Corsaro
Assistant Examiner—Alan T. Gantt

(57) ABSTRACT

The present invention provides a system and method for automatically compensating for transmission line losses at a wireless base station antenna site. Transmission line losses are measured and the result of the measurement is used to adjust a variable gain amplifier which receives reception signals from the transmission line.

20 Claims, 4 Drawing Sheets

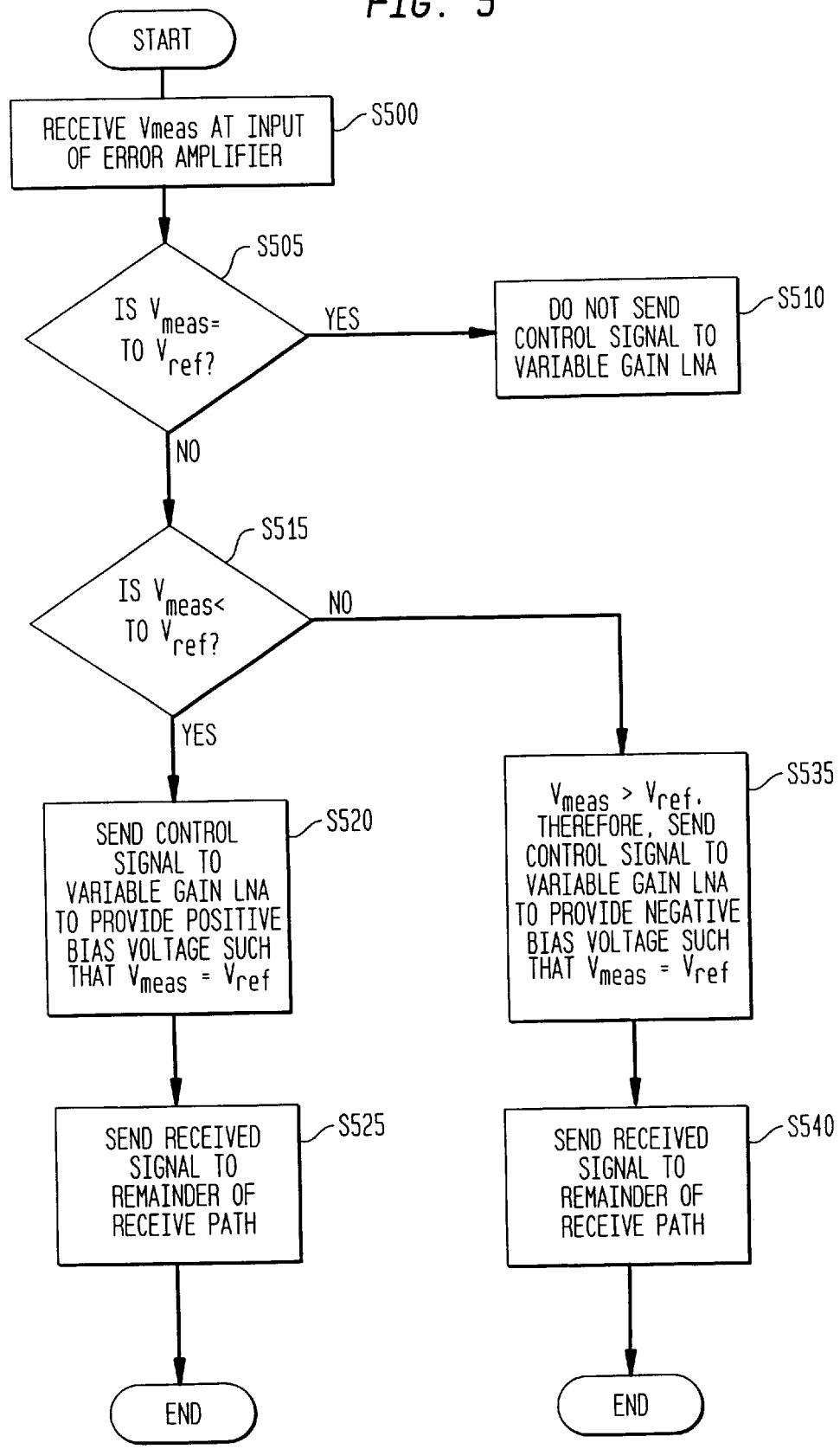

SYSTEM FOR AUTOMATICALLY ADJUSTING RECEIVE PATH GAIN

BACKGROUND OF THE INVENTION

1. Field of the Invention

The present invention relates to the field of wireless communications. More specifically, it relates to a system for automatically sensing changes/variations in receive path gain and compensating for those changes/variations when detected.

2. Description of the Related Art

In order for a wireless communications service provider to claim certain geographic areas (e.g., cells) of coverage, that service provider must be able to guarantee certain minimum criteria of the received signal within that geographic area. That is, the service provider must be able to guarantee a minimum sustained level of signal strength within an entire cell of its service area.

One of the limitations placed upon the service provider is the fact that its radio receivers at the cell site equipment are capable of detecting only those signals that are at least 10 dB above the noise level (a largely fixed value) for a time division multiple access (TDMA) system and those signals at or below the noise level for a code division multiple access (CDMA) system.

Typically, as depicted in FIG. 1, the receiving equipment at a cell site consists of a receiving antenna 100 mounted atop a cell site tower 140 which feeds, via receiver cable 130, into the cell site equipment 135. The cable length varies of course with the height of the cell site tower, however, typically this height can be between 20–200 feet. The cell site equipment 135 typically includes a receiver filter 105, a fixed gain low noise amplifier (LNA) 110, and the remainder of the receiver path 120.

The receiver filter 105, as is known in the art, is used for eliminating both signal noise and any of the signal that is not within a predetermined bandwidth. The output of the receiver filter 105 is then coupled to a fixed gain low noise amplifier (LNA) 110 for amplifying the received signal. The output of the LNA 110 is then coupled to the remainder of the receive path 120 of the cell site equipment 135 (e.g., radio frequency (RF) splitters, etc) and eventually to individual radio receiver ports, as is known in the art.

A problem with using the FIG. 1 receive path to feed into the cell site equipment 135, is that the noise figure experienced between the receiver antenna 100 and the filter 105/LNA 110 combination (i.e., over the 20–200 foot receiver cable 130) is high. In addition, there are variable losses within the cable 130 itself. These cable losses can vary with ambient conditions including temperature, etc. The higher the losses experienced within the cable 130, the lower the signal strength at the cell site equipment 135. For example, approximately 2 dB can be lost in the cable 130 between the receiving antenna 100 and the filter 105/LNA 110 combination. These losses contribute to reducing a service provider's coverage area inasmuch as the coverage area is defined by, among other things, how well the strength of a received signal is maintained from the receiver antenna to the receiver radios and how well that provider can keep the noise figure associated with the received signal to a minimum.

Turning to FIG. 2, an alternative system for receiving wireless signals at a cell site is depicted for reducing the noise figure of the received signal. Similarly to FIG. 1, the FIG. 2 receiver contains the same receiving components (i.e., antenna 100, receiver filter 105, and fixed gain LNA 110), however, these components have been placed on top of the receiver tower 140 along with the receiver antenna 100 at the cell site. Placing the receiving equipment (i.e., filter 105/fixed gain LNA 110) on top of the tower 140, sometimes referred to as the masthead, results in a reduction of the noise figure of the received signal but does not change the receive path gain. These improvements allow the service provider to expand the geographic area that defines the cell site, thereby expanding wireless coverage while effectively using the same receiving equipment.

For example, instead of being able to detect only those signals that are 10 dB above the noise level, with the addition of the fixed gain LNA 110 at the masthead, the antenna may now receive all signals of e.g., only 7 dB above the noise level and still be able to detect those signals at the remainder of the receive path 120. This improvement effectively increases the radius of coverage of the cell.

However, a problem associated with the FIG. 2 receiving system is that the remainder of the receive path 120 is still at the bottom of the tower 140 within the cell site equipment 135, while the receiving components (i.e., antenna 100, filter 105/LNA 110) are mounted atop the tower 140 with approximately 20–200 feet of receiver cable 130 separating them. As a result, receive path gain, while somewhat improved by placing the filter 105/LNA 110 combination atop the tower 140, varies as a function of the instability of e.g., the RF losses and impedance of the receiver cable 130. This instability in the receive path gain effectively reduces the amount of coverage area in a cell site since the required minimum levels of signal strength are not maintained. That is, while the service provider should realize the full 3 dB advantage by placing the LNA 110 on top of the tower, only approximately 1 dB improvement can be realized due to the losses in the cable. Thus, a system and method for automatically sensing cable losses and compensating for those losses as measured at the cell site equipment 135 is desirable.

SUMMARY OF THE INVENTION

The present invention provides a system and method for automatically sensing cable losses and adjusting for those losses as measured at the cell site equipment from a receiver antenna and filter/LNA combination that is located remotely from the cell site equipment. A circuit is provided for sensing a voltage at an exit port to the cell site equipment. If the sensed voltage is different from a predetermined reference voltage, thereby signifying the presence of cable losses, a control signal is delivered from an error amplifier to a variable gain LNA for varying its gain and thereby adjusting (up or down) the strength of the received signal so as to maintain a constant receive path gain. The circuit also provides a source of power for the masthead containing a portion of the receiver circuitry atop the tower.

BRIEF DESCRIPTION OF THE DRAWINGS

These and other features and advantages of the invention will become more readily apparent from the following detailed description which is provided in connection with the accompanying drawings in which:

FIG. 5 illustrates a flowchart depicting operation of a control circuit according to the present invention.

DETAILED DESCRIPTION OF PREFERRED EMBODIMENTS

Figure 1:
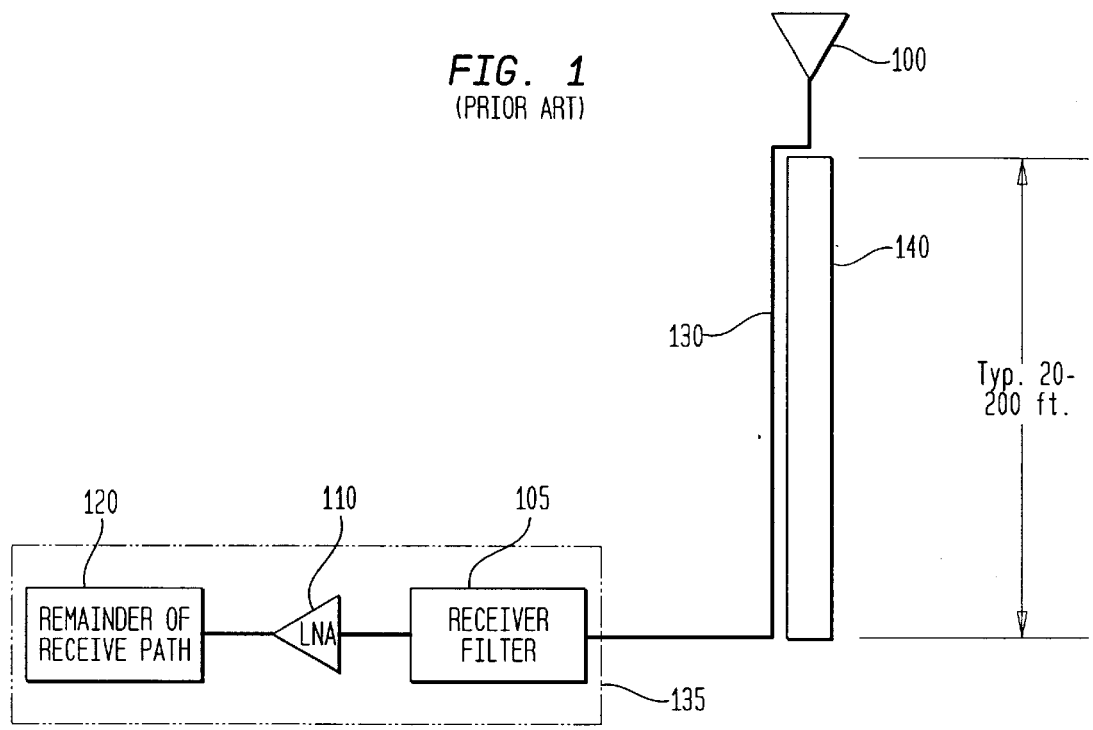
FIG. 1 illustrates a typical cell site receiver system.
Figure 2:
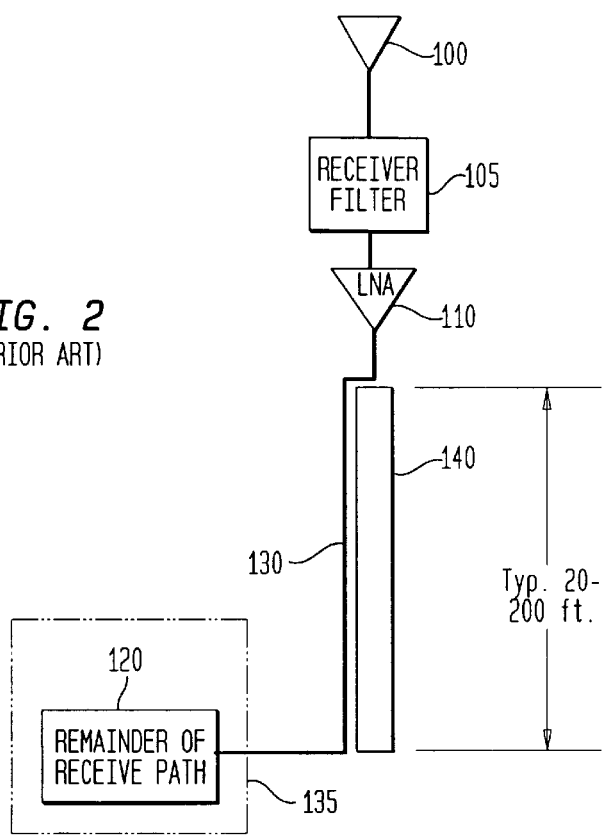
FIG. 2 illustrates another typical cell site receiver system.
Figure 3:
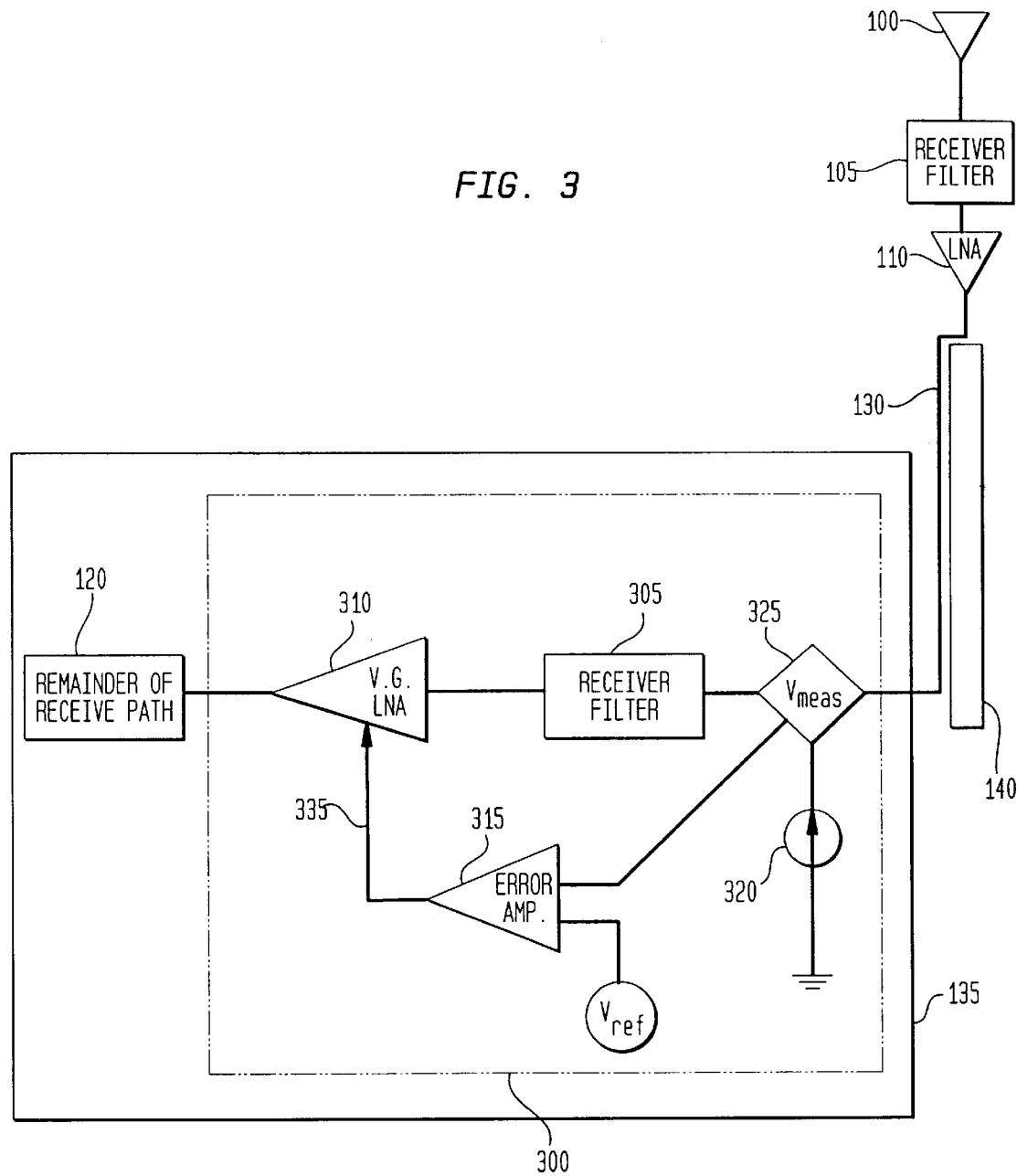
FIG. 3 illustrates a receiver system according to a first embodiment of the present invention.

FIG. 3 illustrates a receiver system according to the present invention in which, similar to the receiver system of FIG. 2, the receiver antenna 100 and the receiver filter 105/fixed gain LNA 110 combination are located atop a receiver tower 140, wherein the output of the antenna is coupled to the input of the filter 105/LNA 110 combination. The output of the filter 105/LNA 110 combination is coupled to a receiver cable 130 for carrying the received signal to the cell site equipment 135.

The cell site equipment 135 of the FIG. 3 receiver system contains a circuit 300 for maintaining a constant receive path gain. The received signal is fed into the cell site equipment 135 and more specifically into receiver port 325. Also coupled to port 325 is a constant current source 320 for providing a source of power, via the receiver cable 130, to the receiver filter 105/fixed gain LNA 110 combination as will be described more fully below. The other side of constant current source 320 is coupled to ground. As is known in the art, a receiver cable, such as e.g., a coaxial receiver cable, contains a center conductor surrounded by a return sheath with foam insulation therebetween to help provide fixed, controlled RF parameters. It is via the center conductor that the constant current source 320 supplies power to the masthead (i.e., to the LNA 110 within the masthead). That is, the constant current source 320 causes a certain known source voltage at the receiver port 325. As current is delivered via the center conductor of cable 130 to power up the LNA 110 via a fixed, known resistance (e.g., via a resistor, a zener diode biasing the LNA, etc.), it is returned back down to receiver port 325 via the outer sheath of cable 130. The voltage of the center conductor is then read at port 325. Since the source current is known at source 320 and the impedance and associated voltage drop at the LNA 110 is also known, the only variable (i.e., in the voltage loop) is the voltage drop in the cable 130 measured at port 325 (i.e., Vmeas). It has been determined that this measured voltage Vmeas is directly proportional to the amount of RF losses in the cable.

Therefore, when the two voltages Vmeas and Vref are known, the losses of the cable are also known. It is these known cable losses for which the invention seeks to compensate. The magnitude of the cable loss is common to all signals travelling through the cable 130. That is, e.g., a 2 dB RF loss in the cable will reduce a 10 dB signal to 8 dB, and a 6 dB signal to 4 dB, and so on.

The receive port 325 then feeds Vmeas to one input of an error amplifier 310 (e.g., a differential amplifier). The other input of error amplifier is Vref. If there is a difference between the two voltages, the error amplifier 310 is configured to send a control signal 335 to a variable gain LNA 310 for varying the gain of the LNA 310 up or down, dependent upon how the two voltages compare with each other so that a constant receive path gain is achieved. In addition, before the received signal reaches the variable gain LNA 310, it may be sent through a "mop up" receiver filter 305 for both sharpening the received signal and eliminating any unwanted frequencies. After the strength of the received signal is adjusted by the variable gain LNA 310, the signal is forwarded to the remainder of the receive path 120 (e.g., RF splitters, etc.) with a constant receive path gain. For example, if the antenna 100 receives a signal at 5 dB above the noise level (normally undetectable), the fixed gain LNA 110 raises it to a detectable signal level of 10 dB above the noise level. Thereafter, although there is a known loss of (e.g., 2 dB) in the cable 130, the invention restores that signal to the original 10 dB above the noise level (i.e., replacing the signal strength lost in the cable 130), thereby effectively turning an undetectable signal (of 8 dB above the noise level) into a detectable signal of 10 dB above the noise level. This advantage allows the service provider to increase the area of wireless coverage with very little added equipment and cost to the cell site equipment 135.

Figure 4:
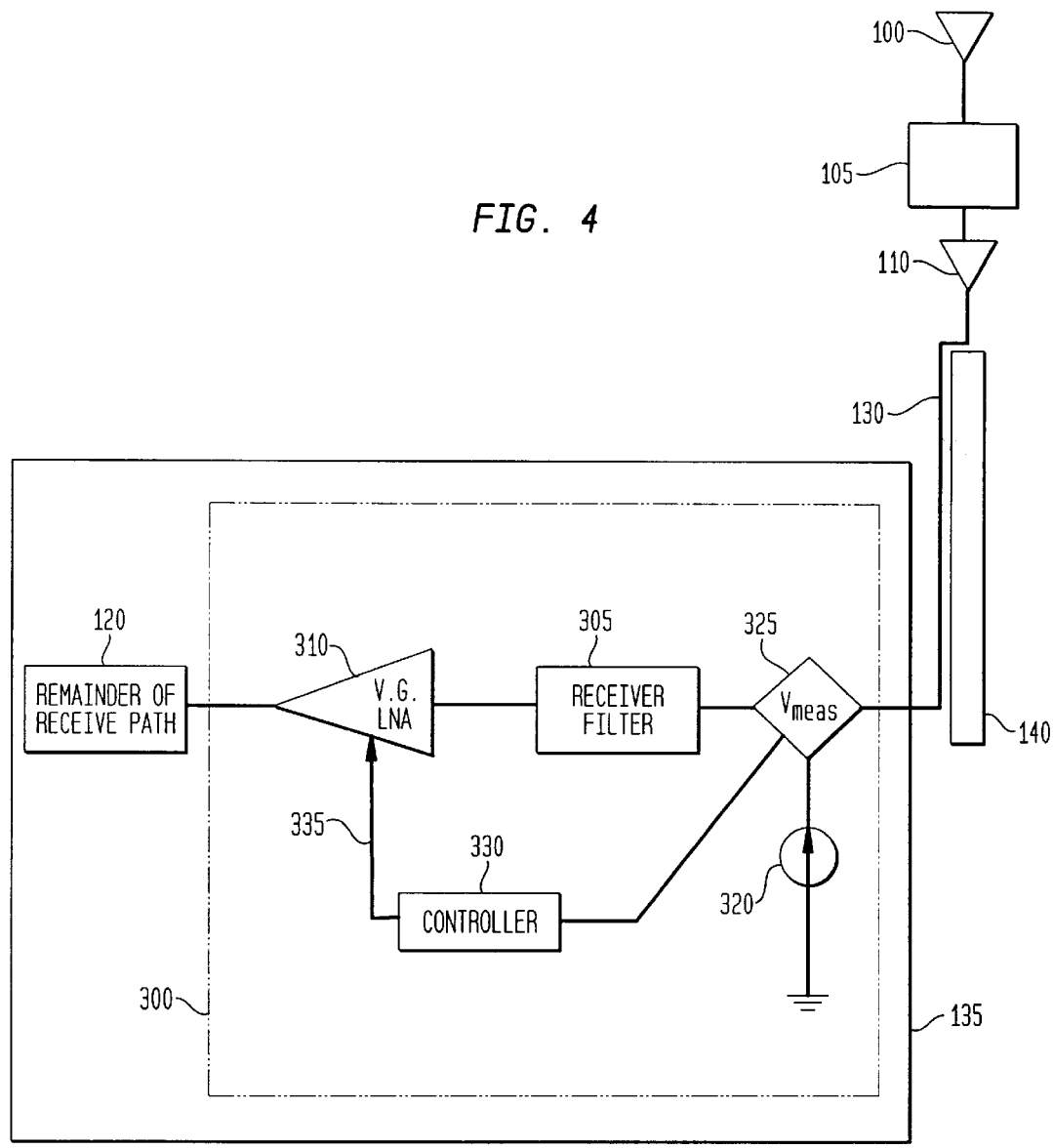
FIG. 4 illustrates a receiver system according to a second embodiment of the present invention.

Turning now to FIG. 4, a second embodiment of the invention is depicted. The FIG. 4 embodiment is identical to the FIG. 3 embodiment except that the error amplifier has been replaced with a controller 330. Controller 330 may be a central processing unit (CPU), a microprocessor, etc. In this embodiment, controller 330 receives the measured voltage Vmeas at an input and then compares that voltage Vmeas with a reference voltage Vref. If the two voltages are equal, or within a predetermined range, the controller 330 is configured to do nothing. If Vmeas is not equal with Vref, then controller 330 is configured to increase (or decrease) the gain of variable gain LNA 310. Thereafter, the received signal is forwarded to the remainder of the receive path 120 with constant receive path gain.

Turning now to FIG. 5, a flowchart is depicted as describing a process flow within circuit 300 and controller 330 of the FIG. 4 system. At step S500, the error amplifier 315 (FIG. 3) or controller 330 (FIG. 4) receives the voltage measured Vmeas at port 325 as returned by the return sheath. At step S505, a decision is made whether Vmeas=Vref. If the two voltages are equal, or within a predetermined range, the error amplifier 315 (FIG. 3) or controller 330 (FIG. 4) is configured to do nothing. That is, at step S510, no control signal is sent to variable gain LNA 310, but rather the received signal passes through to the remainder of the receive path 120 without having its strength adjusted.

If at step S505, Vmeas is determined not to be equal with Vref, a decision is made as to whether Vmeas is less than Vref at step S515. If Vmeas<Vref, then error amplifier 315 or controller 330 sends a control signal 335 to variable gain LNA 310, at step S520, so that a positive bias voltage is applied to the variable gain LNA 310 to increase its gain, thereby increasing the strength of the received signal such that Vmeas=Vref. Thereafter, at step S525, the received signal is forwarded to the remainder of the receive path 120 with constant receive path gain.

If at step S515, it is determined that Vmeas is not less than Vref, the error amplifier 315 or controller 330 concludes that Vmeas is greater than Vref at step S535 and sends a control signal 335 to variable gain LNA 310 so that a negative bias voltage is applied to decrease its gain, thereby decreasing the strength of the received signal such that Vmeas=Vref. Thereafter, at step S540, the received signal is forwarded to the remainder of the receive path 120 with constant receive path gain.

The present invention provides a system for sensing signal strength and automatically adjusting receive path gain after a received signal has reached the cell site equipment from a receiver antenna and filter/LNA combination that is located remotely from the cell site equipment (e.g., atop a receiver tower). The system senses a voltage at a receiver port of the cell site equipment. If the sensed voltage is different from a predetermined reference voltage, a control signal is delivered from an error amplifier to a variable gain LNA for varying the gain of the received signal so as to maintain a constant receive path gain. The circuit also provides a source of power for the masthead containing a portion of the receiver circuitry atop a tower. In an alternative embodiment, the error amplifier is replaced with a controller.

Since the invention reduces variations in receive path gain, it also improves the matching between the two diversity receive paths traditionally provided in cellular base stations. Therefore, the invention allows for the use of tighter tolerances on internal diagnostic tests that involve the receive path.

While preferred embodiments of the invention have been described and illustrated, it should be apparent that many modifications can be made to the invention without departing from its spirit or scope. For example, although systems have been described as containing certain specific components coupled together in a specific manner for sensing a measured voltage and adjusting strength of the received signal, it should be readily apparent that any combination of components may be substituted for the disclosed schematic diagram so long as the object of the circuit is to provide constant receive path gain by sensing and adjusting strength of a received signal at a point within the receiver system that is remote from the actual receiver antenna position and also remote from at least one receiver filter/receiver amplifier stage. Furthermore, although the invention has not been described in connection with any one specific multiple user topology, it should be readily apparent that the invention may be used within a time division multiple access (TDMA) system, and also within a code division multiple access (CDMA) system. Accordingly, the invention is not limited by the foregoing description or drawings, but is only limited by the scope of the appended claims.

What is claimed as new and desired to be protected by Letters Patent of the United States is:

1. A method for receiving wireless signals, comprising:
   receiving wireless signals at an antenna;
   passing the received signals through an amplifier and a transmission line to a receiver port;
   measuring a cable gain or loss of said transmission line, wherein said measuring includes establishing a first voltage on said transmission line with a constant current source, and comparing a detected second voltage at said receiver port with a reference voltage;
   powering said amplifier with said first voltage;
   passing said received signals from said receiver port through a variable gain signal path; and
   adjusting the variable gain of said path in accordance with said measurement.

2. The method as in claim 1 wherein said antenna is a cell site antenna and said antenna is located atop a tower of said cell site, said method further comprising:
   passing said received signals through a receiver filter located atop said tower;
   passing said received signals through an amplifier located atop said tower; and
   passing said received signals through said transmission line.

3. The method as in claim 1, wherein said act of comparing further comprises:
   producing a bias signal which is proportional to the difference between said detected second voltage potential and said reference voltage; and
   using said bias signal to adjust said variable gain.

4. The method as in claim 1, wherein said transmission line is a coaxial cable and said first voltage is applied to a center conductor of said coaxial cable.

5. The method as in claim 4, wherein said second voltage is detected by measuring a voltage potential of a return sheath of said coaxial cable.

6. The method as in claim 3, wherein said bias signal is produced with an error amplifier.

7. The method as in claim 3, wherein said bias signal is produced by a digital controller.

8. The methods as in claim 3, wherein said act of using comprises applying said bias signal to a variable gain low noise amplifier to increase or decrease its gain level.

9. A system for receiving wireless signals, comprising:
   an antenna for receiving wireless signals;
   transmission line connecting said antenna to a receiver port;
   a variable gain amplifier coupled to said transmission line;
   a receiver filter, an input of which is coupled to an output of said antenna for filtering said received signals;
   an amplifier, an input of which is coupled to an output of said receiver filter for amplifying said received signals before said signals are applied to said transmission line;
   a power source coupled to said receiver port for delivering power, via said transmission line, to said amplifier; and
   a measuring circuit for measuring the line loss of said transmission line and for adjusting, the gain of said variable gain amplifier in accordance with the result of said measurement, wherein said measuring circuit measures a voltage drop along said transmission line induced by said power source as a measure of said line loss.

10. The system as in claim 9 wherein said measuring circuit includes a circuit for applying a first voltage to said transmission line; and
    a circuit which measures a second voltage which represents losses in said transmission line.

11. The system as in claim 10 further comprising a comparator circuit which compares said second voltage with a predetermined voltage and provides an adjustment signal to said variable gain amplifier based on the result of the comparison.

12. The system as in claim 9 wherein said comparator circuit includes an error amplifier.

13. The system as in claim 9 wherein said comparator circuit includes a digital processor.

14. The system as in claim 9, wherein said transmission line is a coaxial cable.

15. The system as in claim 14, wherein said measuring circuit applies a first voltage to a center conductor of said coaxial cable, measures a second voltage on an outer sheath of said coaxial cable, and compares the measured second voltage to a predetermined voltage, and produces a gain adjustment signal based on the difference between the measured second voltage and predetermined voltage, said gain adjustment signal being used to adjust the gain of said variable gain amplifier.

16. The system as in claim 15, wherein said measuring circuit derives said first voltage from a constant current source.

17. The system as in claim 9, wherein said variable gain amplifier is a low noise amplifier.

18. The system as in claim 17 further comprising a filter, an input of which is coupled to said transmission line for filtering said received signals before said received signals reach said variable gain amplifier.

19. The system as in claim 9 wherein said measuring circuit measures a voltage drop along said transmission line induced by said power source as a measure of said line loss.

20. The system as in claim 9 wherein said antenna is a cell site antenna.

* * * * *